United States Patent [19]

Abele et al.

[11] 4,271,260

[45] Jun. 2, 1981

[54] POSITIVE NONSILVER WASHOUT SYSTEMS CONTAINING DIHYDROPYRIDINES AND PHOTOOXIDANTS

[75] Inventors: Werner Abele, Neu-Isenburg; Mario Grossa, Dreieich; Otto Pilz, Langen, all of Fed. Rep. of Germany

[73] Assignee: E. I. Du Pont de Nemours and Company, Wilmington, Del.

[21] Appl. No.: 137,625

[22] Filed: Apr. 7, 1980

Related U.S. Application Data

[63] Continuation of Ser. No. 971,663, Dec. 21, 1978, abandoned.

[30] Foreign Application Priority Data

Dec. 27, 1977 [DE] Fed. Rep. of Germany ....... 2758210

[51] Int. Cl.$^3$ .............................................. G03C 5/00
[52] U.S. Cl. .................................... 430/292; 430/326; 430/270; 430/916
[58] Field of Search ............... 96/115 R, 115 P, 90 R; 430/270, 916, 292, 325, 326, 306, 311

[56] References Cited

U.S. PATENT DOCUMENTS

| | | | |
|---|---|---|---|
| 3,782,951 | 1/1974 | Lee | 430/281 |
| 3,901,710 | 8/1975 | Ranz et al. | 430/325 |
| 4,017,313 | 4/1977 | Hartzler | 430/346 |

FOREIGN PATENT DOCUMENTS 1168182 10/1969 United Kingdom ..................... 430/270

*Primary Examiner*—Won H. Louie, Jr.

[57] ABSTRACT

Process for preparation of positive images which comprises exposing imagewise a supported layer of a photosensitive composition comprising an alkali-soluble polymeric binder, at least one dihydropyridine compound and at least one hexaarylbiimidazole compound and developing by washing out the exposed image areas. Optionally auxiliary layers can be present between the support and photosensitive layer. The photosensitive elements are useful in preparing positive working printing plates and photoresists.

14 Claims, No Drawings

POSITIVE NONSILVER WASHOUT SYSTEMS CONTAINING DIHYDROPYRIDINES AND PHOTOOXIDANTS

This is a continuation of application Ser. No. 971,663, filed Dec. 21, 1978, now abandoned.

DESCRIPTION

1. Technical Field

This invention relates to new photosensitive elements, and more particularly to positive-working photosensitive elements.

2. Background Art

Image reproduction processes are known using photosensitive elements wherein the solubility of the photosensitive layer changes upon imagewise exposure. Depending on whether the solubility of the exposed image areas is increased or decreased, a positive or negative imaging element is obtained. A majority of the known image reproduction processes produce negative images.

One positive-working system is based on the photodecomposition of o-quinone diazides. The photodecomposition products occurring therein are more soluble in aqueous alkali than are the starting compounds.

Another positive-working system is disclosed in U.S. Pat. No. 3,782,951 which describes a composition of a hexaarylbiimidazole, a hydrogen donor, an ethylenically unsaturated compound, and an organic polymeric binder. In the disclosed compositions, the hexaarylbiimidazole compound is present in a large excess above the hydrogen donor in order to attain a positive image. A double exposure process is required to achieve the positive image. The first exposure is accomplished imagewise with high intensity radiation. After removal of the imaging master, a second nonimage-wise exposure is accomplished with low intensity radiation. A disadvantage of this process is that each exposure requires a different radiation source.

Still another positive-working system is disclosed in British Pat. No. 1,168,182 wherein the composition contains a hexaarylbiimidazole and a resin soluble in dilute inorganic acids. This system has a disadvantage since the radicals which are formed as a result of the photolysis of the hexaarylbiimidazole compound produce crosslinking with the acid-soluble resins. The solubility increase effected by imagewise exposure is partially offset by the reaction. Additionally, the presence of acid soluble resins in the composition is disadvantageous for certain uses, for example, in photoresist applications wherein the photoresist resin coatings must withstand strong acid treatment baths for etching or plating. It has been found that acid soluble resins are inferior in this respect.

An object of this invention is to provide a photosensitive element for preparing images which overcomes the above-described disadvantage.

DISCLOSURE OF INVENTION

In accordance with this invention there is provided a photosensitive element for the preparation of positive images which comprises a support bearing a photosensitive layer comprising at least one alkali-soluble polymeric binder and a photosensitive system consists essentially of I. at least one dihydropyridine compound of the formula

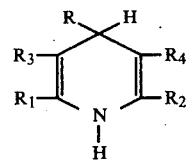

wherein

R is alkyl, aryl and heteroaryl, $R_1$ and $R_2$ which can be the same or different, are alkyl, and $R_3$ and $R_4$, which can be the same or different, are COOR', COR', CN, R' is alkyl; and II. at least one hexaarylbiimidazole compound of the formula

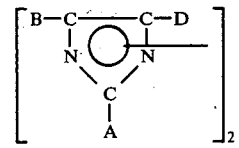

wherein the radicals A, B and D are either identical or different and are optionally substituted aryl groups derived from carbocyclic or heterocyclic compounds.

The dihydropyridine compounds can, for example, be produced according to methods of the Hantzsch synthesis from one mol of an aliphatic or aromatic aldehyde, one mol of ammonia, and 2 mol of either a β-ketocarbonic acid ester, a β-ketocarbonic acid nitrile, or a β-diketone. When using β-aminocrotonic acid esters, the addition of ammonia becomes unnecessary. Other procedures are described in Elderfield, Heterocyclic Compounds, Volume 1, 1950, page 462, as well as Gattermann/Wieland, Die Praxis des Organischen Chemikers, 39th edition 1959, page 132. Suitable dihydropyridine compounds are compiled in Table 1, below. In R alkyl ranges from 1 to 11 carbon atoms, alkenyl ranges from 3 to 11 carbon atoms, aryl ranges from 6 to 10 carbon atoms and heteroaryl ranges from 4 to 10 carbon atoms; in $R_1$ and $R_2$ alkyl ranges from 1 to 4 carbon atoms, preferably methyl or ethyl; and in $R_3$ and $R_4$, R' is alkyl of 1 to 11 carbon atoms.

TABLE 1

| COMPOUND I NO. | R | $R_1$ | $R_2$ | $R_3$ | $R_4$ |
|---|---|---|---|---|---|
| 1 | —CH$_3$ | —CH$_3$ | —CH$_3$ | —COOCH$_3$ | —COOCH$_3$ |
| 2 | —CH$_3$ | —CH$_3$ | —CH$_3$ | —COOC$_2$H$_5$ | —COOC$_2$H$_5$ |
| 3 | —CH$_3$ | —CH$_3$ | —CH$_3$ | —COOC$_4$H$_9$ (tert) | —COOC$_4$H$_9$ (tert) |
| 4 | —CH$_3$ | —CH$_3$ | —CH$_3$ | —CN | —CN |
| 5 | —CH$_3$ | —CH$_3$ | —CH$_3$ | —COCH$_3$ | —COCH$_3$ |

TABLE 1-continued

| COMPOUND I NO. | R | $R_1$ | $R_2$ | $R_3$ | $R_4$ |
| --- | --- | --- | --- | --- | --- |
| 6 | —$CH_3$ | —$C_2H_5$ | —$C_2H_5$ | —$COOC_2H_5$ | —$COOC_2H_5$ |
| 7 | —$C_2H_5$ | —$CH_3$ | —$CH_3$ | —$COOC_2H_5$ | —$COOC_2H_5$ |
| 8 | —$C_3H_7$ | —$CH_3$ | —$CH_3$ | —$COOC_2H_5$ | —$COOC_2H_5$ |
| 9 | —$C_{11}H_{23}$ | —$CH_3$ | —$CH_3$ | —$COOC_2H_5$ | —$COOC_2H_5$ |
| 10 | —$CH_2$—Phenyl | —$CH_3$ | —$CH_3$ | —$COOC_2H_5$ | —$COOC_2H_5$ |
| 11 | —CH=CH—$CH_3$ | —$CH_3$ | —$CH_3$ | —$COOC_2H_5$ | —$COOC_2H_5$ |
| 12 | —(CH=CH)$_2$—$CH_3$ | —$CH_3$ | —$CH_3$ | —$COOC_2H_5$ | —$COOC_2H_5$ |
| 13 | —Phenyl | —$CH_3$ | —$CH_3$ | —$COOC_2H_5$ | —$COOC_2H_5$ |
| 14 | —CH=CH—Phenyl | —$CH_3$ | —$CH_3$ | —$COOCH_3$ | —$COOCH_3$ |
| 15 | —CH=CH—Phenyl | —$CH_3$ | —$CH_3$ | —$COOC_2H_5$ | —$COOC_2H_5$ |
| 16 | —CH=CH—Phenyl | —$CH_3$ | —$CH_3$ | —$COOC_4H_9$ | —$COOC_4H_9$ |
| 17 | -4-Pyridyl | —$CH_3$ | —$CH_3$ | —$COOC_2H_5$ | —$COOC_2H_5$ |
| 18 | -2-Furyl | —$CH_3$ | —$CH_3$ | —$COOC_2H_5$ | —$COOC_2H_5$ |

Compounds 2, 7, 8 and 10 are preferred.

A typical procedure for producing a dihydropyridine compound (Compound No. 3 of Table 1) is described below:

In a three necked flask cooled with ice, 11.5 ml acetoaldehyde, 65 ml acetoacetic acid -tert.-butyl ester and 100 ml ethanol are mixed while stirring, and during continued stirring and cooling, 24 ml 25% aqueous ammonia solution are added dropwise. In this process the temperature should not exceed 35° C. After the addition is completed, stirring is continued for ½ hour and subsequently boiling takes place under reflux for 6 hours. The dihydropyridine precipitated after cooling is recrystallized from ethanol. Yield 38.5 g., melting point 162–163° C.

Hexaarylbiimidazole compounds are described in the German Pat. No. 1,300,013 and U.S. Pat. No. 3,630,736. From the compounds mentioned there, the hexaarylbiimidazoles disclosed in Table 2 are preferred.

TABLE 2

| Compound II No. | A | B | D |
| --- | --- | --- | --- |
| 1 | -Phenyl | -Phenyl | -Phenyl |
| 2 | -2-Chlorophenyl | -Phenyl | -Phenyl |
| 3 | -2-Chlorophenyl | -3-Methoxyphenyl | -3-Methoxyphenyl |
| 4 | -2-Methoxyphenyl | -Phenyl | -Phenyl |

Components I and II, described above, contained in the photosensitive layer can fluctuate within broad limits depending on the use. Amount ranges which lead to especially good results are 5 to 30% by weight dihydropyridine Compound I and 10 to 50% by weight hexaarylbiimidazole Compound II based on the total weight of the photosensitive composition.

To prepare the photosensitive elements, the photosensitive composition comprised of dihydropyridine and hexaarylbiimidazole components with at least a known compatible organic alkali-soluble polymer binder is applied to a support by a procedure as described below. A large number of alkali soluble binders are known, e.g., acrylic acid and/or methacrylic acid polymers and/or their copolymers with other suitable monomers, e.g., acrylic acid esters or other acryl derivatives, vinyl compounds such as vinyl ethers, vinyl acetates or their saponification products, styrene, vinyl pyrrolidone, butadiene and related monomers; copolymers of maleic acid anhydride, maleic acid, maleic acid half esters, maleic acid, half amides and derivatives of relates compounds, e.g., itaconic acid, with suitable comonomers, e.g., styrene, ethylene, vinyl acetate, etc; polystyrene sulfonic acids and/or their copolymers; cellulose derivatives, e.g., carboxymethyl cellulose, cellulose phthalate or cellulose succinate; alginic acids and their derivatives. Additionally, phenol-formaldehyde resins, known under the designation Novolac ® are suitable.

Copolymers of maleic acid anhydride or maleic acid half esters with styrene have proven to be especially advantageous binders for the production of the photosensitive elements. The concentration of the polymeric binder is about 20 to 80% by weight based on the total weight of the photosensitive composition.

In addition to the mentioned components, the photosensitive layers can optionally contain further additives in amounts known to those skilled in the art, e.g., sensitizers, stabilizers, dyes, pigments, delustering agents, softeners, auxiliary coating agents, etc. Michler's ketone is preferred as a sensitizer.

A large number of transparent or opaque materials can be used as a support for the photosensitive layers, e.g., paper, optionally treated with barite; cardboard; metal foils, e.g., aluminum, copper, steel, etc.; wood; glass; foils or fiber webs of natural or synthetic polymers, e.g., polyamides, rubber, polyethylene or polypropylene, linear polyesters, e.g., polyethylene terephthalate; cellulose, cellulose esters, polyvinly chloride or their copolymers, polyacrylonitrile, etc.

A special protective film present over the photosensitive layer which must be removed before the development procedure is generally not necessary. It can, however, if desired, be present to prevent damage to the photosensitive coating. If necessary, it is also possible to apply additional nonphotosensitive coatings to the support, for example, an antihalation coating.

The components of the photosensitive layer are generally deposited as a solution in volatile solvents according to well-known methods and subsequently dried. Suitable solvents are, for example, methylene chloride, acetic acid ethylester, acetone, etc. Other depositing methods without the use of solvents such as calendering, extruding or the like are also useful.

The concentration of the nonvolatile components of the coating solution can fluctuate within broad limits but is dependent on the coating method and the layer or relief thickness desired for the different purposes of application.

For the production of the images, the photo-sensitive element is exposed with radiation sources which emit a radiation rich in ultraviolet light, for example, mercury vapor lamps, xenon lamps, etc. through a master copy. The exposed image areas are then developed by washing out the exposed areas of the image. For this development process, preferably aqueous alkaline solutions are used which can contain, for example, as suitable alkalis alkali-carbonates, borates and alkalihydroxides as well as the well-known carbonate, borate and phosphate buffer systems. The development solutions can, furthermore, contain surface active substances.

BEST MODE FOR CARRYING OUT THE INVENTION

The best mode is illustrated in Example 3 wherein the photosensitive element contains a photo-sensitive layer containing styrene/maleic anhydride binder and Compounds 2 from each of Tables 1 and 2.

INDUSTRIAL APPLICABILITY

The photosensitive elements are useful for a number of purposes including positive working printing plates of diverse kinds, e.g., for offset printing or relief printing; positive working photoresist layers, e.g., for the production of printed circuits; or copying films for the production of positive contact copies. In the latter case, the photosensitive layers contain dyes or pigments. In a special embodiment for the production of copying films, the dye or pigment present in the photosensitive layer can be entirely or partially located in a separate layer between the support and the photosensitive layer.

EXAMPLES

The following examples illustrate the invention.

EXAMPLE 1

A coating solution of the following composition is prepared:
10 g phenolformaldehyde resin (Alnovol ®)
2 g of Compound 3 of Table 1
2 g of Compound 3 of Table 2
0.2 g of a blue triaryl methane dye (Victoria Pure Blue ® FGA) (CI Basic Blue 81)
75 ml methylene chloride/acetone (9:1 by volume)
The solution is applied to an aluminum plate as is used for the production of offset printing plates. The plate is then exposed through a master copy for 120 seconds with a mercury vapor lamp (1,000 watts) at a distance of 60 cm. Subsequently, the plate is developed with an aqueous 0.2 standard NaOH solution (90 seconds, 20° C.) and rinsed with water whereby the exposed image portions are washed out. A positive working offset printing plate with a high useful life is obtained.

EXAMPLE 2

A coating solution of the following composition is prepared:
10 g copolymer acrylic acid ethylester/methacrylic acid methylester/acrylic acid (55/40/5 mol%), average molecular weight 260,000
4 g of the Compound 17 of Table 1
4 g of the Compound 2 of Table 2 0.5 g of Michler's ketone
75 ml methylene chloride/acetone (9:1 by volume)
The solution is applied to an aluminum plate as is used for the production of offset printing plates. The plate is then exposed through a master copy for 90 seconds with a mercury vapor lamp (1,000 watts) at a distance of 60 cm. Subsequently, the plate is treated with a solution of the following composition (80 seconds, 25° C.):
2 g potassium carbonate
1 g potassium hydrogen carbonate
97 g water
and is then rinsed with water whereby the exposed image portions are washed out. A positive working offset printing plate with a high useful life is obtained.

EXAMPLE 3

A coating solution of the following composition is prepared:
3.5 g copolymer styrene/maleic acid anhydride (50/50 mol %)
1.0 g copolymer acrylic acid ethylester/methacrylic acid methylester/acrylic acid (55/40/15 mol %), average molecular weight 26,000
1.5 g of Compound 2 to Table 1
3.5 g of Compound 2 of Table 2
1.0 polyethylene oxide, average molecular weight, 1,500
75 ml methylene chloride/methanol (9:1 by volume)
The solution is applied to a polyethylene glycol terephthalate film support.

This material is laminated with the coating side on a copper printed circuit board as is used for the production of printed circuits and exposed behind a master copy for 60 seconds with a mercury vapor lamp (1,000 watts) at a distance of 80 cm. After removing the polyester film, the plate is treated with a solution of the following composition:
2 g potassium carbonate
1 g potassium hydrogen carbonate
and is then sprayed with water whereby the exposed image portions are removed. The plate is subsequently etched in a known manner with an aqueous ferrichloride solution of 48° Be and the remaining resist layer is removed by treating it with a 0.5 standard caustic soda solution. A positive metallic conductive circuit image is obtained.

EXAMPLE 4

A coating solution of the following composition is prepared:
9.5 g copolymer acrylic acid ethylester/methacrylic acid methylester/acrylic acid (55/40/5 mol %), average molecular weight 26,000
7.0 g copolymer styrene/maleic acid anhydride (50/50 mol %)
4.0 g of the Compound 2 of Table 1
4.0 g of the Compound 2 of Table 2
2.5 g carbon pigment
75 ml methylene chloride
The solution is applied to a substrate of polyethylene glycol terephthalate. The film is then exposed through a line or screen master copy for 50 seconds with a mercury vapor lamp (1,000 watts) at a distance of 80 cm. Subsequently, the film is developed with a solution of the following composition (25 seconds, 35° C.):
2.8 g potassium carbonate
0.6 g potassium hydrogen carbonate
96.6 g water
and is then sprayed with water whereby the exposed image areas are washed out. A positive black and white copy of the master copy used is obtained.

EXAMPLE 5

A coating solution of the following composition is prepared:
25 g partially esterified copolymer styrene/maleic acid anhydride (50/50 mol %), available as SMA 17,352 from the ARCO Chem. Co.

5 g of the Compound 1 of Table 1
10 g of the Compound 4 of Table 2
100 ml acetone The solution is applied to a polypropylene substrate. This film is laminated with the coating side on a dry coating, half consisting of a partially esterified styrene/-maleic acid anhydride copolymer and half of a black dye "Zaponechtschwarz RE", which is present on a polyethylene terephthalate substrate.

This material is exposed through the polypropylene film through a line or screen master copy for 120 seconds with a mercury vapor lamp (1,000 watts) at a distance of 80 cm. Subsequently, the film is developed after removal of the polypropylene film with a solution of the following composition (30 seconds, 20° C.):

1.5 g sodium carbonate (water-free)
0.5 g sodium hydrogen carbonate
98.0 g water and subsequently rinsed with water whereby the photosensitive layer as well as the black coating under it are washed out at the exposed image locations. A positive black and white copy of the master copy used is obtained.

We claim:

1. A process for the preparation of positive images which comprises exposing imagewise to actinic radiation a photosensitive element which comprises a support bearing a photosensitive layer comprising at least one alkali-soluble polymeric binder and a photosensitive system consisting essentially of
   I. at least one dihydropyridine compound of the formula

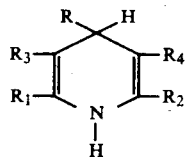

wherein
   R is alkyl, alkenyl of 3 to 11 carbon atoms, phenyalkyl, phenylalkenyl, unsubstituted aryl of 6 to 10 carbon atoms and unsubstituted heteroaryl,
   $R_1$ and $R_2$, which can be the same or different, are alkyl, and
   $R_3$ and $R_4$, which can be the same or different, are COOR', COR', CN, R' is alkyl; and
   II. at least one hexaarylbiimidazole compound of the formula

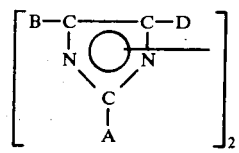

wherein the radicals A, B and D are either identical or different and are optionally substituted aryl groups derived from carbocyclic or heterocyclic compounds, and developing by washing out the exposed areas of the image.

2. A process according to claim 1 wherein the dihydropyridine compound is 2,4,6-trimethyl-3,5-bis(carbethoxy)-1,4-dihydropyridine.

3. A process according to claim 1 wherein the dihydropyridine compound is 2,6-dimethyl-4-ethyl-3,5-bis(carbethoxy)-1,4-dihydropyridine.

4. A process according to claim 1 wherein the dihydropyridine compound is 2,6-dimethyl-4-n-propyl-3,5-bis(carbethoxy)-1,4-dihydropyridine.

5. A process according to claim 1 wherein the dihydropyridine compound is 2,6-dimethyl-4-benzyl-3,5-bis(carbethoxy)-1,4-dihydropyridine.

6. A process according to claim 1 wherein the hexaarylbiimidazole compound is 2,2',4,4',5,5'-hexaphenylbiimidazole.

7. A process according to claim 1 wherein the hexaarylbiimidazole compound is 2,2'-bis(2-chlorophenyl)-4,4',5,5'-tetraphenylbiimidazole.

8. A process according to claim 1 wherein the hexaarylbiimidazole compound is 2,2'-bis(2-chlorophenyl)-4,4',5,5'-tetrakis(3-methoxyphenyl)biimidazole.

9. A process according to claim 1 wherein the hexaarylbiimidazole compound is 2,2'-bis(2-methoxyphenyl)-4,4'5,5'-tetraphenylbiimidazole.

10. A process according to claim 1 wherein a sensitizer is present in the photosensitive layer.

11. A process according to claim 10 wherein the sensitizer is Michler's ketone.

12. A process according to claim 1 wherein a dye or pigment is present in the photosensitive layer.

13. A process according to claim 1 wherein a dye or pigment is at least partially present in a nonphotosensitive auxiliary layer present between the support and the photosensitive layer.

14. A process according to claim 1 wherein the exposed areas of the image are washed out with an aqueous alkaline solution.

* * * * *